(12) United States Patent
Dzienis et al.

(10) Patent No.: US 10,969,417 B2
(45) Date of Patent: Apr. 6, 2021

(54) METHOD, PROTECTIVE DEVICE AND PROTECTIVE SYSTEM FOR DETECTING A FAULT ON A LINE OF AN ELECTRICAL POWER SUPPLY SYSTEM (71) Applicant: SIEMENS AKTIENGESELLSCHAFT, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 112 days.

(21) Appl. No.: 16/169,055

(22) Filed: Oct. 24, 2018

(65) Prior Publication Data

US 2019/0120892 A1 Apr. 25, 2019

(30) Foreign Application Priority Data

Oct. 24, 2017 (EP) .................................... 17197997

(51) Int. Cl.
*G01R 31/08* (2020.01)
*H02H 7/26* (2006.01)
(Continued)

(52) U.S. Cl.
CPC ........... *G01R 31/085* (2013.01); *H02H 3/305* (2013.01); *H02H 7/265* (2013.01); *H04B 1/0042* (2013.01); *H04B 17/20* (2015.01)

(58) Field of Classification Search
CPC ........ G01R 31/08; G01R 19/25; G01R 31/02; G01R 31/086; G01R 31/007;
(Continued)

(56) References Cited

U.S. PATENT DOCUMENTS 6,867,577 B2 3/2005 Kerger et al.
9,917,662 B2 3/2018 Jurisch
(Continued)

FOREIGN PATENT DOCUMENTS

EP 1236259 B1 5/2010
WO 2015110150 A1 7/2015

OTHER PUBLICATIONS

Special Focus: Understanding the IEEE 1588 Precision Time Protocol (PTP), IEEE , Nov. 6, 2015, downloaded on Oct. 10, 2017: http://www.ni.com/newsletter/50130/en; 2015.

*Primary Examiner* — Vincent Q Nguyen
*Assistant Examiner* — Trung Nguyen
(74) *Attorney, Agent, or Firm* — Laurence A. Greenberg; Werner H. Stemer; Ralph E. Locher (57) ABSTRACT

A method detects a fault on a line of an electrical power supply system, in which current values are measured at the line ends of the line and the current values are used to check whether there is a fault on the line. In order to perform monitoring of the line such that faults can be detected comparatively quickly and sensitively, it is proposed that voltage values are also measured at the line ends. The respective measured current and voltage values are used to ascertain respective comparison current values indicating the current flowing at a comparison location on the line and the respective comparison current values are used to check for the presence of a fault on the line, and a fault signal is generated if the check has resulted in a fault present on the line being detected.

16 Claims, 7 Drawing Sheets

(51) Int. Cl.
*H04B 17/20* (2015.01)
*H04B 1/00* (2006.01)
*H02H 3/30* (2006.01)

(58) Field of Classification Search
CPC .......... G01R 31/085; H02H 3/26; H02H 3/30;
H02H 7/26; H02H 3/081; H02H 3/385;
H02H 3/46; H02H 3/40; Y04S 10/52;
H04L 12/10; H04L 41/04
USPC .. 324/500, 508, 425–440, 444, 255, 764.01,
324/522, 713, 771, 72.5, 76.11, 134, 111,
324/117 R, 538–543, 600, 756.01
See application file for complete search history.

(56) References Cited

U.S. PATENT DOCUMENTS

| | | | |
|---|---|---|---|
| 2003/0058594 A1* | 3/2003 | Kerger | H02H 7/263 |
| | | | 361/80 |
| 2013/0107405 A1* | 5/2013 | Blumschein | H02H 1/0092 |
| | | | 361/79 |
| 2015/0233976 A1* | 8/2015 | Johannesson | G01R 31/40 |
| | | | 324/764.01 |
| 2017/0199237 A1 | 7/2017 | Dzienis et al. | |

\* cited by examiner

METHOD, PROTECTIVE DEVICE AND PROTECTIVE SYSTEM FOR DETECTING A FAULT ON A LINE OF AN ELECTRICAL POWER SUPPLY SYSTEM

CROSS-REFERENCE TO RELATED APPLICATION

This application claims the priority, under 35 U.S.C. § 119, of European application EP 17197997.4, filed Oct. 24, 2017; the prior application is herewith incorporated by reference in its entirety.

BACKGROUND OF THE INVENTION

Field of the Invention

The invention relates to a method for detecting a fault on a line of an electrical power supply system, in which first current values are measured at a first line end of the line, further current values are measured at least at a further line end of the line and the first and the further current values are used to check whether there is a fault on the line. The invention relates furthermore to a protective device for detecting a fault on a line of an electrical power supply system and to a corresponding protective system.

A method of the type stated at the outset and a corresponding protective device are known from European patent EP 1 236 259 B1 (corresponding to U.S. Pat. No. 6,867,577), for example, which describes what is known as a differential protection method for lines in power supply systems. Differential protection is one of the most selective protection methods known. This involves a line having two or more ends being monitored for freedom from faults and, in the event of a fault, a fault signal being generated in order to isolate the line from the remainder of the system. The monitoring criterion used is Kirchhoff's nodal rule. The sum of the currents flowing into a line and flowing out on the other side must ideally amount to zero for a fault-free line. If this is no longer the case, the line has a fault and is isolated from the system.

A main application of differential protection is current-based differential protection. This involves the currents measured at the line ends being summed with the correct arithmetic sign and the resulting current sum being compared with a difference current threshold value. In the event of the threshold value being exceeded, the fault signal is generated. In order to allow better robustness for the method when forming the current differences, usually only the fundamental component from the current signals is used as a complex vector. Thus, an influence of a different transmission of the DC component can be largely eliminated by primary transformers used for current measurement on the line. A disadvantage of the use of the fundamental vector, however, is that determining the fundamental vector requires measured values to be recorded over a period duration of the current signal. Thus, the trip time for current differential protection of this kind cannot be below a period duration of the fundamental signal (e.g. 20 ms at 50 Hz).

When measuring current using analog current transformers, there is also the possibility of what is known as transformer saturation. This results in the current signals transmitted by the transformer being corrupted, particularly by DC components contained in the primary current, after a saturation-free time such that the current sum formed by the differential protection amounts to a value not equal to zero even in the case of a fault-free line, and hence would cause an excess function (disconnection of a fault-free line). The protection principle of current differential protection can therefore be used only if the saturation-free time of the transformers is longer than the trip time for the differential protection and at the same time saturation detection for the transformers ensures that the differential protection is blocked in the event of transformer saturation.

A comparatively fast differential protection principle provides for charges to be measured instead of the currents and for fault detection to be performed on the basis of instantaneous values of the charge. A charge differential protection method of this kind is known from the aforementioned European patent EP 1 236 259 B1, for example. Often, the threshold values used for charge-based differential protection methods of this kind are set so as to be relatively insensitive, however, which means that weak-current faults can be detected only with difficulty.

Setting out from a method and protective device of the type cited at the outset, the invention is based on the object of performing monitoring for a line of a power supply system such that faults can be detected comparatively quickly and sensitively.

SUMMARY OF THE INVENTION

This object is achieved by proposing a method according to the main method claim. This develops a method of the type cited at the outset such that first voltage values are measured at the first line end of the line and further voltage values are measured at the at least one further line end of the line. The first current and voltage values measured at the first line end are used to ascertain first comparison current values indicating the current flowing at a comparison location on the line. The comparison location chosen can be any point on the line between the line ends. It is possible e.g. to choose the middle of the line or one of the line ends as the comparison location. The further current and voltage values measured at the at least one further line end are used to ascertain further comparison current values indicating the current flowing at the comparison location on the line. The first and the further comparison current values are used to check for the presence of a fault on the line, and a fault signal is generated if the check has resulted in a fault present on the line being detected.

As a result of current and voltage values from the ends of the line being used to determine comparison currents for a comparison location on the line, it is possible to detect very quickly and sensitively whether there is a fault on the line. This is because the comparison currents are concordant only for the fault-free case on the line, whereas a significant disparity arises in the event of a fault being present. This allows a decision about the presence of a fault to be made more quickly than in the case of current differential protection systems using fundamental vectors. Moreover, the short time needed for the decision means that the risk of a transformer saturation decreases, since the decision about the presence of a fault can for the most part already be made in what is known as the saturation-free time of the transformer, for example shorter than 3 ms.

In particular on long lines (e.g. lines upward of 50 km in length), significant capacitive leakage currents arise. These leakage currents may be more than 10% of the rated current of the line and appear as a difference in the total current of the differential protection. In order to avoid erroneous tripping of the current differential protection on account of the leakage currents, the trip threshold for conventional current differential protection is increased by the absolute value of the leakage currents, and hence the sensitivity of the protection is decreased. Very high-impedance faults can therefore no longer be detected by this conventional protection principle.

Thus, according to an advantageous embodiment of the method according to the invention, it is proposed that the comparison current values be determined by using a mathematical model of the line for the fault-free case.

A mathematical model of this kind already takes into consideration the proportion of the capacitive leakage currents, which means that they cannot corrupt the result and do not have to be compensated for by means of a less sensitive setting.

Specifically, in this context, according to a further advantageous embodiment of the method according to the invention, there is provision for the comparison current values to be estimated by using the first and the further current and voltage values and also the mathematical model of the line, wherein the estimation is performed by considering the propagation of travelling waves along the line.

Advantageously, this exploits the theory of the propagation of travelling waves along the line, in order to take the current and voltage values measured at the line ends as a basis for inferring the comparison current at the comparison location. In this manner, given knowledge of line parameters of the fault-free line, such as e.g. a propagation constant for the propagation of travelling waves along the line and a characteristic impedance, a mathematical line model valid for the propagation of travelling waves can be used to perform determination of the comparison current values. Since the travelling wave line model used means that the method takes into consideration the capacitive leakage currents in the calculation of the transient current at the common comparison location, the disadvantage of insensitivity as a result of the capacitive charging currents is avoided.

Contemplation of travelling waves in connection with power supply systems has to date conventionally been used for fault location after a fault has occurred. Use for the purposes of differential protection for detecting and clearing a fault is not known to date, however.

Specifically, in this context, there may be provision for the comparison current values to be estimated by subjecting the first and the further current and voltage values to a filtering, wherein the filter is used to reproduce a transfer function dependent at least on the propagation constant of a travelling wave along the line and/or a transfer function dependent on the characteristic impedance of the line.

This allows suitable filtering of the current and voltage values to be used to ascertain the sought comparison current values with comparatively little computation complexity by taking into consideration the propagation constant on the line and/or the characteristic impedance of the line. Examples of suitable digital filters are what are known as "FIR filters" (FIR=Finite Impulse Response) and "IIR filters" (IIR=Infinite Impulse Response).

A further advantageous embodiment of the method according to the invention provides for the first and the further comparison current values to be used to form a fault magnitude, and for a fault on the line to be detected if the fault magnitude exceeds a prescribed threshold value.

In this manner, application of a single criterion allows very fast detection of whether there is a fault on the line. Preferably, the fault magnitude can comprise firstly a hold component, containing at least a sum of the RMS values of the comparison current values determined from the line ends, and secondly a trip component, which contains a sum formed by adding the individual comparison currents with a correct arithmetic sign. This trip component normally assumes a value close to zero. Comparison of the trip component with the hold component allows a decision to be made about the presence of a fault. By way of example, this can be accomplished by comparison of the ascertained fault magnitude with a threshold value. In the event of the threshold value being exceeded, a fault that is present is detected.

The currents to be measured at the line ends can be measured only indirectly using current transformers. These current transformers frequently have a high-pass filter response, which is typically different for the measurement points at the ends of the line. Particularly the DC components arising in the event of a short are translated differently by the current transformers, which means that the response of the transformers can result in a corruption of the measured currents arising.

To avoid this as far as possible, according to a further advantageous embodiment of the method according to the invention, there is provision for the first and the further current and voltage values to be subjected to a filtering using a high-pass filter. This achieves attenuation of the DC component to a negligible degree.

A further advantageous embodiment of the method according to the invention provides for the ascertainment of the comparison current values to be performed at each line end, and for the comparison current values ascertained at the respective line ends to be transmitted between the line ends by means of an IP-based data communication.

According to this embodiment, the comparison current values calculated for the common comparison location from the local current and voltage values are exchanged via an IP-based communication connection.

It is regarded as particularly advantageous in this context if a line having more than two line ends results in the transmission of the comparison current values between the line ends being effected by means of multicast messages.

In this manner, a comparison current value determined at one end of the line can be sent to the protective devices at all other ends at the same time by means of a multicast message, which means that dedicated messages are not required for each receiver protective device.

In order to be able to associate the comparison current values determined at the line ends with one another, there is provision, according to a further advantageous embodiment of the method according to the invention, for the comparison current values to be assigned timestamps.

The determination of the current and voltage values at the respective line ends, from which the respective comparison current values are formed, needs to be effected at all ends of the line at the same time. If this is not the case, sensitive detection of faults on the line cannot be performed. The time synchronization of the differential protective devices among one another needs to be able to be ensured over distances several kilometers in length in this case. Traditionally, dedicated communication connections have been used for this application, which were used to transmit the measured values with deterministic delays. The timing of the devices was synchronized by calibrating the delays of the communication connections. The calibration method used assumes an identical delay for the forward and return channels of the communication connection. Once the delay was known, the data windows for recording the measured values could be synchronized sufficiently accurately. These dedicated communication connections used in conventional systems have been replaced by communication networks as a result of the technical progress of communications engineering. In these communication networks, the failure of a communication link allows another path through the network to be chosen. This leads to a sudden change in the delay through the communication network. If this change of delay is not detected, then incorrect positioning of the data window for measured value recording arises in at least one of the differential protective devices. This incorrect window position can lead to erroneous tripping of the differential protection.

Thus, according to a further advantageous embodiment of the method according to the invention, it is proposed that the timers used for time-stamping at the respective line ends be synchronized by a time pulse of a central timer or a time synchronization protocol, preferably PTP.

By way of example, the timers in the individual protective devices can be synchronized by using a time pulse of the GPS system. Alternatively, a time synchronization protocol can also be used, which does not require an external central timer, but rather uses time synchronization messages sent via the communication network. An example of this is the Precision Time Protocol (PTP). This advantageously involves the timings of the protective devices involved in differential protection being synchronized using the Precision Time Protocol (PTP) via the same communication connection as is also used for exchanging the comparison current values. The advantage of this is that the timing synchronization continues to be operational even in the event of failure of an external timer.

According to a further advantageous embodiment of the method according to the invention, it is proposed that the check to determine whether there is a fault on the line be performed at each line end.

The effect that can be achieved by this is that fault detection is performed redundantly, namely in the devices at all line ends, which means that the reliability of the fault detection increases overall.

In this context, it is also regarded as advantageous if comparison current values are received at each line end that have been ascertained at the other line ends, and the received comparison current values and the locally ascertained comparison current values are time aligned with one another by means of a renewed sampling and a subsequent interpolation.

This advantageously makes it possible to ensure that the measurement times can be aligned with one another even without measured value recording with synchronous timing. This is because comparison current values of this kind that have been recorded at different times are recalculated for a common measurement time in this case by means of renewed sampling and subsequent interpolation.

The aforementioned object is also achieved by a protective device for detecting a fault on a line of an electrical power supply system. The protective device has a measuring device set up for recording first current values measured at a first line end of the line, has a communication device set up for receiving further current values measured at least at a further line end of the line, and has an evaluation device set up to use the first and the further current values to check whether there is a fault on the line. According to the invention, there is provision for the measuring device to be set up to record first voltage values measured at the first line end of the line, for the communication device to be set up to receive further voltage values measured at the at least one further line end of the line, and for the evaluation device to be set up to use the first current and voltage values measured at the first line end to ascertain first comparison current values indicating the current flowing at a comparison location on the line, and to use the further current and voltage values measured at the at least one further line end to ascertain further comparison current values indicating the current flowing at the comparison location on the line, and to use the first and the further comparison current values to check for the presence of a fault on the line and to generate a fault signal if the check has resulted in a fault present on the line being detected.

All observations made above and below in regard to the method according to the invention apply in respect of the protective device according to the invention and vice versa, mutatis mutandis; in particular, the protective device according to the invention is set up for performing the method according to the invention in any embodiment or in a combination of any embodiments. Reference is also made to the advantages described for the method according to the invention in respect of the advantages of the protective device according to the invention.

Finally, the aforementioned object is also achieved by a protective system for detecting a fault on a line of an electrical power supply system, wherein the protective system has at least two protective devices that are connected to one another via a communication connection.

In one embodiment of the protective system according to the invention, there may be provision for the protective system to be set up to detect a fault on a line having more than two ends, and for a protective device to be provided at each end of the line, wherein all protective devices are connected to one another via the communication connection.

All observations made above and below in regard to the method according to the invention and the protective device according to the invention apply in respect of the protective system according to the invention and vice versa, mutatis mutandis; in particular, the protective system according to the invention is set up for performing the method according to the invention in any embodiment or in a combination of any embodiments. Reference is also made to the advantages described for the method according to the invention in respect of the advantages of the protective system according to the invention.

Other features which are considered as characteristic for the invention are set forth in the appended claims.

Although the invention is illustrated and described herein as embodied in a method, a protective device and a protective system for detecting a fault on a line of an electrical power supply system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
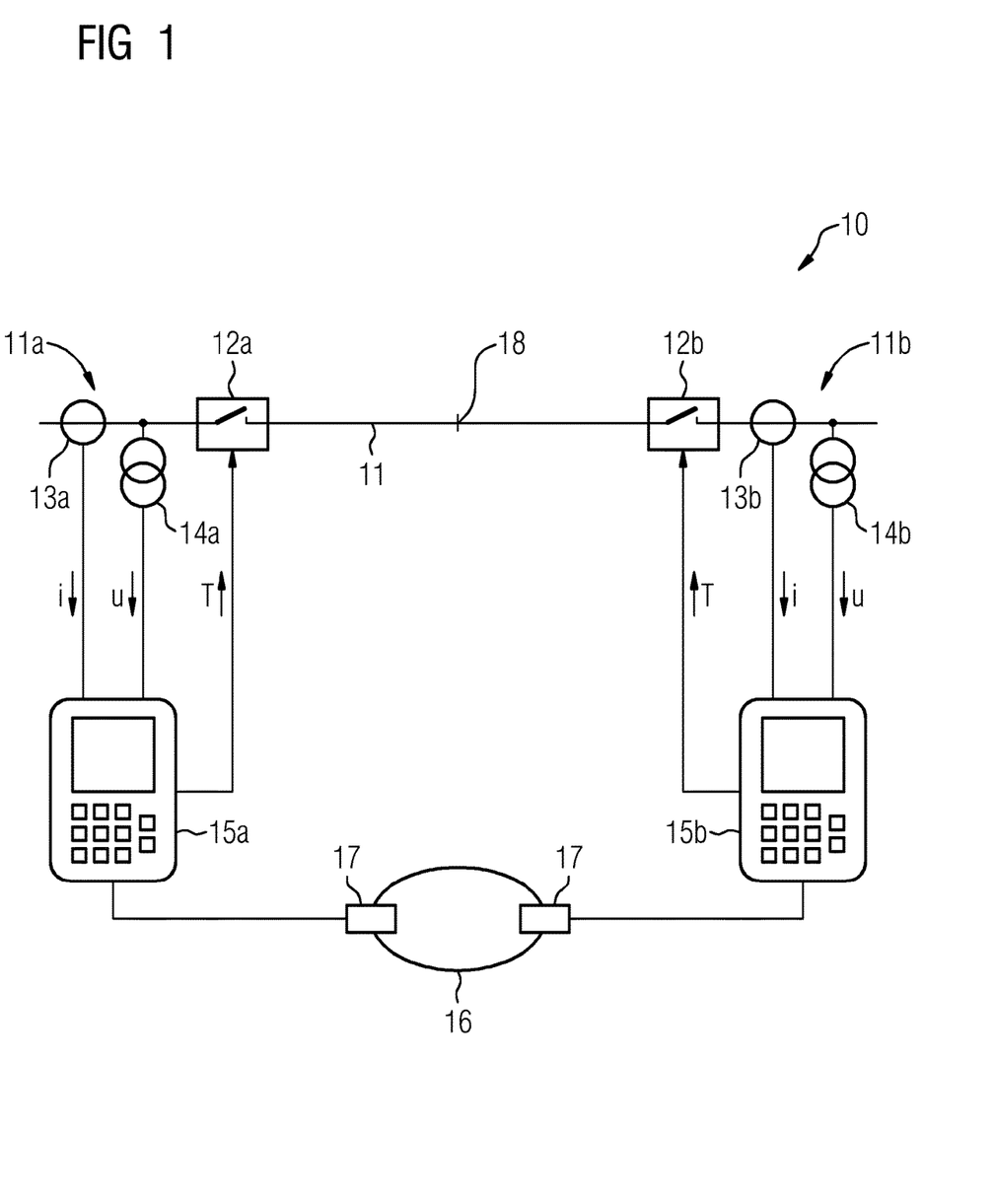
FIG. 1 is a schematic view of a first exemplary embodiment of a line of a power supply system.

Referring now to the figures of the drawings in detail and first, particularly to FIG. 1 thereof, there is shown a schematic view of a protective system 10 for detecting a fault on a line of an electrical power supply system, which is not depicted in more detail in FIG. 1. In this regard, FIG. 1 shows an electrical line 11 of the power supply system in a simplified depiction. The line 11 may be a single-phase or polyphase line. The line 11 is bounded at its line ends 11a and 11b by circuit breakers 12a, 12b and can be disconnected from the rest of the power supply system thereby, in particular in the event of a fault. The line ends 11a, 11b are also provided with measurement points at which current and voltage values are recorded using current transformers 13a, 13b and voltage transformers 14a, 14b, which are depicted merely by way of example in FIG. 1. The current transformers 13a, 13b and the voltage transformers 14a, 14b may be what are known as conventional or unconventional transformers. On the secondary side, the transformers deliver current values i and voltage values u, which may be analog or digitized values.

The current transformers 13a, 13b and the voltage transformers 14a, 14b have protective devices 15a, 15b connected to them at the respective line ends 11a, 11b for the purpose of detecting a fault on the line 11. The protective devices 15a, 15b use a measuring device to record the current and voltage measured values, and perform digitization and/or preprocessing if need be. In this case, the respective measured values are also assigned a timestamp precisely indicating the time at which they are recorded. For this purpose, the protective devices 15a, 15b have internal timers whose timings are synchronized to one another by means of popular methods, e.g. GPS time pulses, IRIG-B, Precision Time Protocol (PTP) according to IEEE 1588. On the basis of the time-stamping, the measured values picked up at the two line ends 11a, 11b are comparable with one another.

The protective devices 15a, 15b may be electrical differential protective devices, for example, which monitor the operating state of the line 11 on the basis of the recorded current and voltage values and, in the event of a fault, transmit a fault signal T to their respective circuit breaker 12a, 12b in order to prompt it to open its switching contacts.

The protective devices 15a, 15b comprise one evaluation device each, which is respectively set up to monitor the line 11 for a fault (e.g. short, ground fault). Moreover, the protective devices 15a, 15b have one communication device each, via which they are connected to one another by means of a communication connection 16. The communication connection 16 may be any suitable wired or wireless communication connection in the form of a dedicated connection or a communication network. In the example of FIG. 1, the communication connection 16 is configured as a communication network to which the protective devices are connected via network components 17, for example routers or switches. The communication connection 16 can be used by the protective devices 15a, 15b to exchange data messages, the content of which is used for detecting a fault on the line 11. Moreover, they can use the communication connection 16 to exchange messages that are used for synchronizing the timings of the timers of the protective devices.

To monitor the line 11 for faults, the respective protective devices 15a, 15b use the current and voltage values measured at their respective line end 11a, 11b to determine respective comparison current values indicating the current flowing at a comparison location 18 chosen on the line. The comparison current values determined by the different line ends 11a, 11b can finally be used to infer any fault. If a fault is detected, an evaluation device 42 delivers a fault signal F that can be used for actuating the circuit breaker 12a associated with the protective device 15a. Moreover, the fault signal can also be transmitted via the communication device to the other protective devices 15b, 15c in order to trip the respective circuit breakers 12b, 12c there. Instead of or in addition to circuit breaker tripping, the fault signal can alternatively be used as an excitation signal for further protective applications of the protective device 15a and/or can be output to a network operator as an alarm signal. The specific approach for detecting a fault that is present is explained later on.

Figure 2:
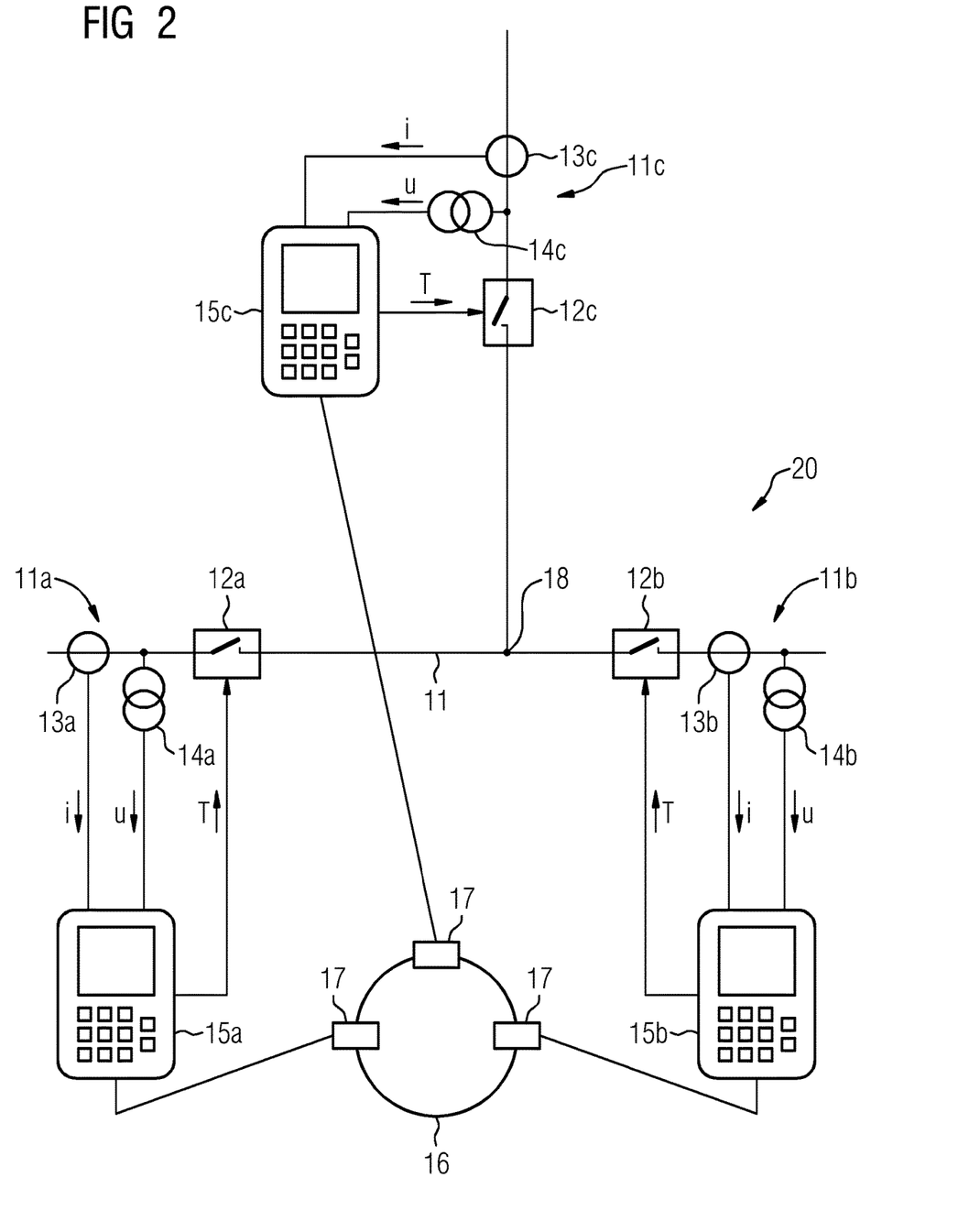
FIG. 2 is a schematic view of a second exemplary embodiment of the line of the power supply system.

FIG. 2 shows another exemplary embodiment of a protective system 20. In this case, mutually corresponding or comparable components are denoted by the same reference signs. The protective system 20 shown in FIG. 2 differs from the protective system 10 of FIG. 1 in particular in that the line 11 now has three ends 11a, 11b, 11c instead of two. At the third line end 11c too, a circuit breaker 12c is provided that can be used to isolate the line 11 from the rest of the power supply system. For this purpose, the end 11c is also provided with a protective device 15c, which evaluates current and voltage values measured at the line end 11c and, in the event of a fault, generates a fault signal T in order to prompt the circuit breaker 12c to open its contacts. Furthermore, the protective device 15c is also connected to the communication connection 16 via a network component 17. The protective devices 15a, 15b, 15c are connected to one another via the communication connection 16, which according to FIG. 2 is configured as a communication network.

The protective devices 15a, 15b, 15c are used, using the current and voltage values measured at their respective line end 11a, 11b, 11c, to determine respective comparison current values indicating the current flowing at a common comparison location 18. The comparison location 18 chosen in the example of FIG. 2 is the node at which the three line ends meet. On the basis of the comparison current values from all line ends, it is possible to infer the presence of a fault.

The protective devices 15a, 15b and 15c of FIGS. 1 and 2 can apply what is known at the travelling wave principle for detecting faults. This exploits the circumstance that a current signal propagates on the line 11 at approximately the speed of light. Therefore, if the current and voltage at one point on the line are known, it is possible to infer the current at another point on the line. An approach for sensitive fault detection is described below. First of all, a brief explanation of the principle of travelling waves needs to be provided for this purpose. For this, a propagation model for travelling waves along the line 11 is used.

The algorithm in question is obtained by using "long-line theory". This is the model-based mapping of an electrical line in the form of what are known as "distributed parameters". This is depicted by way of example in FIG. 3.

Figure 3:
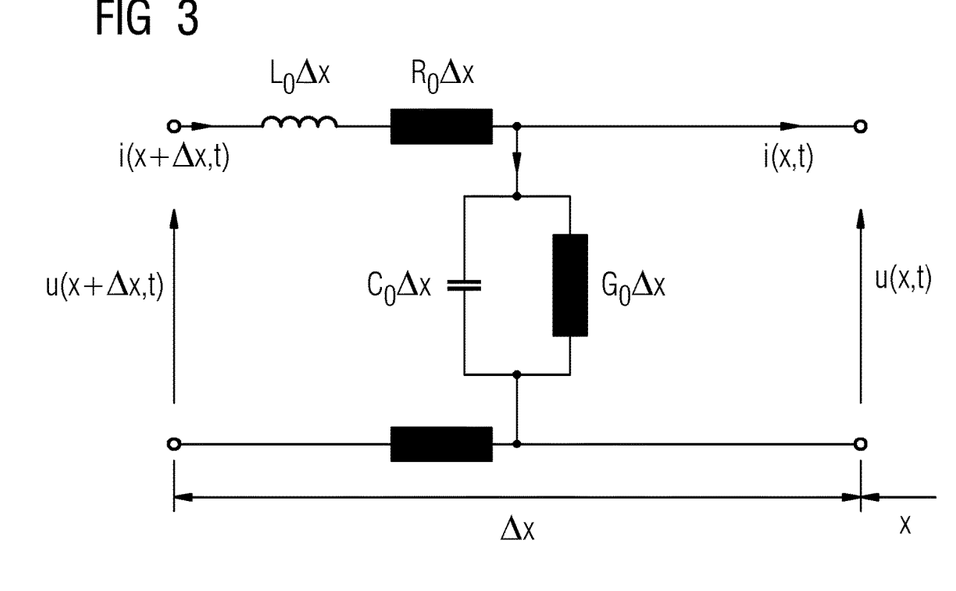
FIG. 3 is a circuit showing a depiction of electrical parameters of a line section $\Delta x$ to explain a propagation of a current signal on a basis of a travelling wave principle.

FIG. 3 reveals that the network parameters such as inductance per unit length $L_0$, capacitance per unit length $C_0$, resistance per unit length $R_0$ and conductivity per unit length $G_0$ are distributed along the line. Based on this line model, using Kirchhoff's laws for the section $\Delta x$ of the line, the following equations can be obtained for the voltage u and the current i:

$$a)\ u(x+\Delta x, t) = R_0 \Delta x \cdot i(x+\Delta x, t) + L_0 \Delta x \frac{\partial i(x+\Delta x, t)}{\partial t} + u(x,t) \quad (1)$$

$$b)\ i(x+\Delta x, t) = G_0 \Delta x \cdot u(x, t) + C_0 \Delta x \frac{\partial u(x, t)}{\partial t} + i(x, t). \quad (2)$$

Mathematical transformations allow equations (1) and (2) to be converted into the following form:

$$a)\ \frac{\partial u(x,t)}{\partial x} = R_0 \cdot i(x,t) + L_0 \frac{\partial i(x,t)}{\partial t} \quad (3)$$

$$b)\ \frac{\partial i(x,t)}{\partial x} = G_0 \cdot u(x,t) + C_0 \frac{\partial u(x,t)}{\partial t}. \quad (4)$$

These equations (3) and (4) are partial differential equations for a homogeneous line and are usually referred to as "telegraph equations". They can be generalized to apply to any numbers of conductors.

By considering equations (3) and (4) in the Laplace domain, assuming x as a parameter (distance of the comparison location from the measurement point), it is possible for many effects occurring the line to be interpreted much more easily:

$$\frac{\partial u(x,s)}{\partial x} = R_0 \cdot i(x,s) + sL_0 \cdot i(x,s) \quad (5)$$

$$\frac{\partial i(x,s)}{\partial x} = G_0 \cdot u(x,s) + sC_0 \cdot u(x,s). \quad (6)$$

The derivation of equations (5) and (6) according to parameter x produces the following:

$$\frac{\partial^2 u(x,s)}{\partial x^2} = Z(s)Y(s) \cdot u(x,s) \quad (7)$$

$$\frac{\partial^2 i(x,s)}{\partial x^2} = Y(s)Z(s) \cdot i(x,s). \quad (8)$$

Equations (7) and (8) can be solved for a voltage and current separately using differential equation theory:

$$U(x) = e^{-\gamma(s)x} \cdot A_1 + e^{\gamma(s)x} \cdot A_2 \quad (9)$$

$$Z_c(s) \cdot I(x) = e^{-\gamma(s)x} \cdot A_1 - e^{\gamma(s)x} \cdot A_2 \quad (10).$$

When solving equations (9) and (10), it is possible to calculate the unknown parameters $A_1$ and $A_2$ from the initial conditions:

$$A_1 = \tfrac{1}{2}(U_1(s) + Z_c(s) \cdot I_1(s)) \quad (11)$$

$$A_2 = \tfrac{1}{2}(U_1(s) - Z_c(s) \cdot I_1(s)) \quad (12)$$

where $U_1$ and $I_1$ are the initial conditions when x=0.

Furthermore, equations (9) and (10) contain what is known as a characteristic impedance $Z_c$ and the propagation constant $\gamma$, these being able to be calculated from the line parameters:

$$\gamma(s)^2 = Z(s)Y(s) \quad (13)$$

$$Z_c(s) = \gamma(s)^{-1} \cdot Z(s) \quad (14).$$

In this case, Z represents the series impedance and Y represents the shunt admittance of a section of the line. The values are indicated in relation to length in each case.

The following forms are therefore obtained for equations (9) and (10):

$$U(x,s) = \tfrac{1}{2}e^{-\gamma(s)x} \cdot (U_1(s) + Z_c(s) \cdot I_1(s)) + \tfrac{1}{2}e^{\gamma(s)x} \cdot (U_1(s) - Z_c(s) \cdot I_1(s)) \quad (15)$$

$$Z_c(s) \cdot I(x,s) = \tfrac{1}{2}e^{-\gamma(s)x} \cdot (U_1(s) + Z_c(s) \cdot I_1(s)) - \tfrac{1}{2}e^{\gamma(s)x} \cdot (U_1(s) - Z_c(s) \cdot I_1(s)) \quad (16).$$

Equations (15) and (16) represent a voltage-related and current-related propagation model for travelling waves along the line 11 that can be used for determining comparison currents at a comparison location using the travelling wave method.

Figure 4:
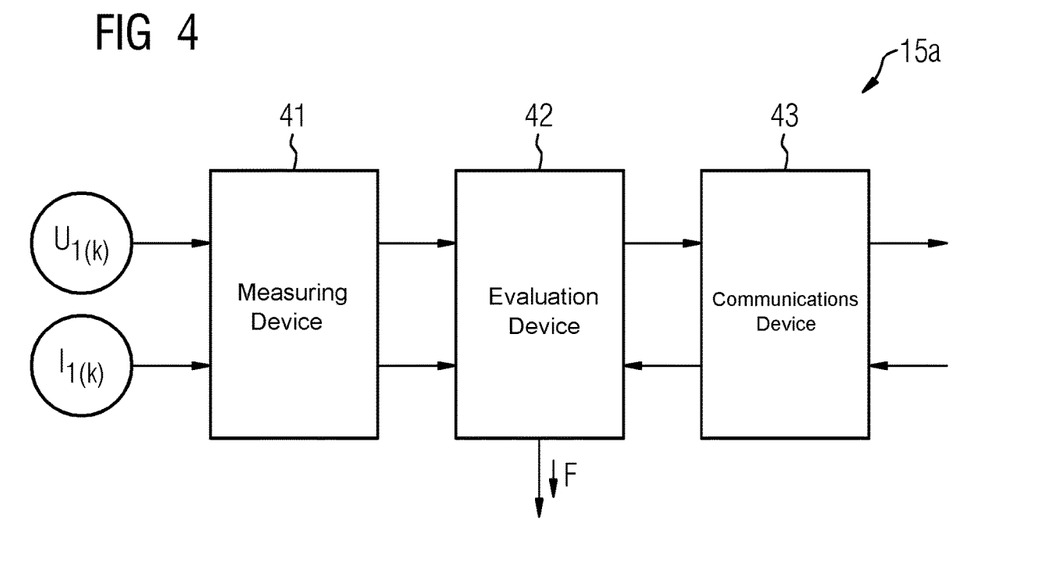
FIG. 4 is a schematic block diagram of an exemplary embodiment of an electrical protective device.

FIG. 4 will be taken as a basis for explaining the approach for fault detection using a possible example. In this regard, FIG. 4 shows a schematic block diagram of an exemplary embodiment of a protective device, for example the protective device 15a (cf. FIGS. 1 and 2), for detecting a fault on a line. The other protective devices 15b, 15c are of corresponding design.

The protective device 15a has a measuring device 41, the evaluation device 42 and a communication device 43. The evaluation device 42 may be e.g. a microprocessor that accesses an applicable piece of device software that is in a memory of the protective device 15a. Alternatively, it may also be an arithmetic block with hardware-determined programming, e.g. an ASIC or FPGA.

Figure 5:
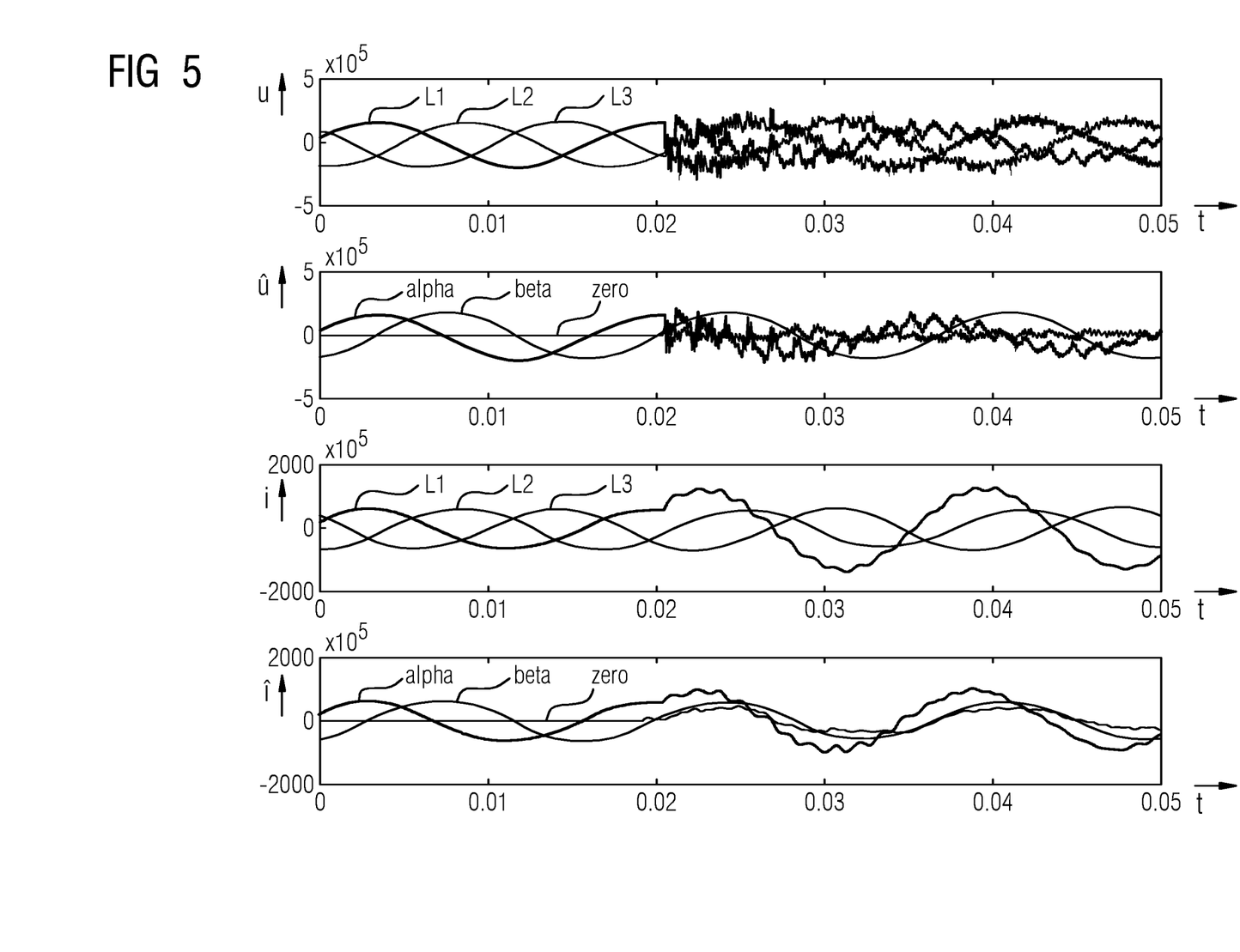
FIG. 5 is a graph showing profiles of current and voltage during a fault on a line.

First of all, the measuring device 41 is used to measure the local currents and voltages present at the applicable line end 11a and to generate corresponding current and voltage values. These measured values are converted into samples of the current and voltage signals. An example of the recorded current and voltage measured values can be seen in FIG. 5; the occurrence of a fault can be seen at approximately t=0.02 s.

In the case of three-phase power supply systems, it is also optionally possible for the respective signals to be handled by means of a transformation (e.g. Clarke transformation, in the case of which the signals are expressed as "alpha", "beta" and "zero" components), e.g. in order to decouple the phase-related components. The resultant signals are likewise shown in FIG. 5. The transformation can take place in the measuring device 41 or in the downstream evaluation device 42.

If the subsequent evaluation is intended to take place in the frequency domain, a conversion of the transformed current and voltage values into the frequency domain can take place. This is preferably affected by means of a Fast Fourier Transformation (FFT) or Discrete Fourier Transformation (DFT).

A determination of comparison current values indicating the current on the line at a previously chosen comparison location (distance x from the measurement point) on the line also takes place by means of the evaluation device 42 using the current and voltage values—if need be transformed and converted to the frequency domain. The locally determined comparison current is firstly used for the fault detection in the evaluation device and is secondly delivered to the communication connection 16 (cf. FIGS. 1 and 2) via the communication device 43.

The communication connection 16 is used by all protective devices 15a, 15b, 15c (cf. FIGS. 1 and 2) to exchange the respective locally determined comparison current values among one another. Given knowledge of the comparison current values from all line ends, the fault detection in the evaluation devices of the individual protective devices 15a, 15b, 15c can be performed.

An approach that can be used to determine the comparison current values on the basis of the locally measured current and voltage values is explained below.

Rearrangement of equations (15) and (16), where the reference location chosen is the beginning of the line and the comparison location chosen is $x_0$, produces the following set of equations (17):

$$a) \begin{pmatrix} U_{x0}(s) \\ I_{x0}(s) \end{pmatrix} = \begin{pmatrix} \cosh(\gamma(s) \cdot x_0) & Z_c(s) \cdot \sinh(\gamma(s) \cdot x_0) \\ \frac{1}{Z_c(s)} \cdot \sinh(\gamma(s) \cdot x_0) & \cosh(\gamma(s) \cdot x_0) \end{pmatrix} \begin{pmatrix} U_1(s) \\ I_1(s) \end{pmatrix}. \quad (17)$$

This set of equations (17) describes, in the frequency domain, how the signals $U_{x0}$ and $I_{x0}$ at the comparison location $x_0$ can be calculated from the signals $U_1$ and $I_1$ from the first line end.

In order to be able to ascertain the signals from the sequences of samples, the equations can be transformed into the z domain. This is shown by way of example using the prediction equation for ascertaining the estimated comparison current $I_{x0}(s)$ at the comparison location from the current and voltage signals $I_1(s)$ and $U_1(s)$ from the first line end:

$$i_{x0}(z) = Y_c(z) \cdot G_1(z) \cdot u_1(z) + G_2(z) \cdot i_1(z) \quad (18).$$

The transfer functions used in equation (18) are defined as follows in this instance:

$$G_1(z) = F^{-1}\{\sinh(\gamma(s) \cdot x_0)\} \quad (19)$$

$$G_2(z) = F^{-1}\{\sinh(\gamma(s) \cdot x_0)\} \quad (20)$$

$$Y_c(z) = F^{-1}\left\{\frac{1}{Z_c(s)}\right\}. \quad (21)$$

Figure 6:
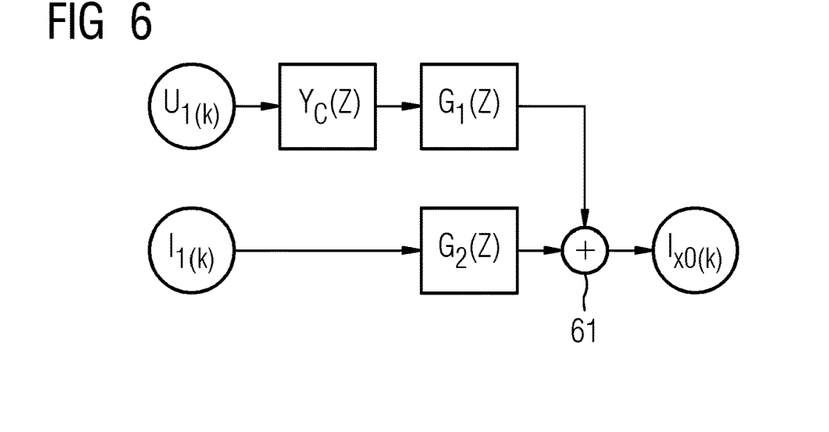
FIG. 6 is a logic diagram to explain a determination of a comparison current value.

Advantageously, the transfer functions $G_1(z)$ and $G_2(z)$ taking into consideration the propagation constant γ can be mapped by an FIR filter and the transfer function $Y_c(z)$ taking into consideration the characteristic impedance $Z_c$ can be mapped by an IIR filter. Therefore, the estimated comparison current at the comparison location of the line can be determined from the current and voltage signal from the first line end using a logic arrangement as depicted in FIG. 6. The blocks $Y_c(z)$, $G_1(z)$ and $G_2(z)$ in this case are a realization of equations 18-21 and form the comparison current value $i_{x0}$ at the common comparison location $x_0$ as seen from the first line end. The estimated comparison current $i_{x0}$ at the comparison location $x_0$ is formed from the current and voltage values $i_1$ and $u_1$ measured at the first line end by applying transfer functions $G_1(z)$ and $G_2(z)$ and also $Y_c(z)$ (e.g. by filtering) and by means of addition in an adder 61. The logic arrangement shown in FIG. 6 may in this case be implemented in the form of a piece of hardware or a piece of processor-executed software in the protective device 15a.

Figure 10:
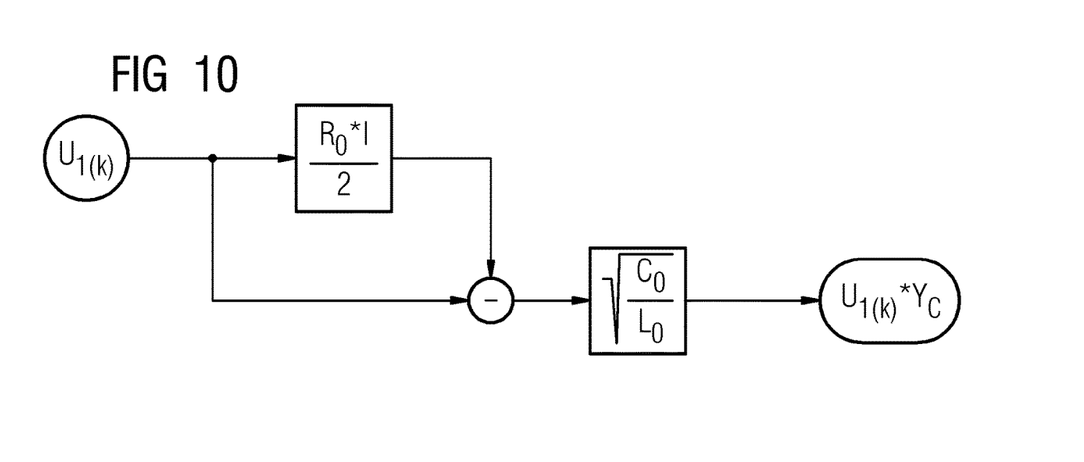
FIG. 10 is a logic diagram to explain the determination of a transfer function of a digital filter.

The transfer function $Y_c(z)$ can be calculated from the frequency response of the characteristic impedance $Z_c$ by means of a least squares estimator, for example. If it is possible to dispense with modelling the frequency dependency of the parameters R', G', L' and C' and the conductance G' can be assumed to be very small (which is always the case for frequencies below 50 kHz and overhead lines), then the convolution product of $Y_c$ with the local voltage of the line can also be formed using an arrangement shown by way of example in FIG. 10. The transfer functions $G_1$ and $G_2$ can be formed by inverse FFT from the terms of the hyperbolic functions using the argument γl.

Therefore, according to equation 18, a travelling wave model of the line is used in order to calculate the comparison current $i_{x0}(k)$ at a common comparison location on the line from the transient current and voltage signals from the local line end. The variable k in this case represents the k-th sample. On the basis of the comparison currents from all line ends that are determined for the common comparison location, it is then possible to infer the presence of a fault.

The common comparison location in the case of a two-ended line (cf. FIG. 1) may be the middle of the line or the other end of the line in each case, for example. In the case of a three-ended line (cf. FIG. 2), this common comparison location is preferably the point on the line at which the T line branches off. Accordingly, for lines having more than three ends, the comparison location can be stipulated at one of the nodes.

When data windows of approximately 1-2 ms duration are used for measurement, a fault magnitude A for the line can be formed with sufficient accuracy and can be used to assess the presence of a fault. The fault magnitude can be formed according to the following formula, for example:

$$A = \sqrt{\frac{\sum_{j=0}^{M} \left(\sum_{T=1}^{N} (i_{x0}^T(k-j))\right)^2}{P \cdot \sum_{j=0}^{M} \sum_{T=1}^{N} (i_{x0}^T(k-j))^2 + P_0}}. \quad (19)$$

The meanings of the terms in formula 19 are as follows:
a) A: fault magnitude;
b) $i_{x0}^T$: comparison current as seen from the line end T;
c) $x_0$: comparison location on the line;
d) M: number of samples in the data window;
e) N: number of line ends to be taken into consideration;
f) j: count variable for the samples in the data window;
g) T: count variable for the line end to be examined;
h) k: present sample;
i) P: selectable weighting factor;
j) $P_0$: selectable stabilization value.

The proposed fault magnitude uses the comparison currents that have been determined for the common comparison location x0 by means of measurements at the respective line ends. Its denominator has a "hold component" formed by squaring and summing the individual comparison currents. The result obtained as the hold component is the sum of the rms values of the comparison currents predicted by the ends, weighted with a factor P and stabilized with a factor P0. The numerator of the proposed fault magnitude has a "trip component" formed by adding the individual comparison currents with the correct arithmetic sign and subsequently squaring them. Adding the comparison currents with the correct arithmetic sign in the numerator of the fault magnitude A should yield a value close to zero for a fault-free line. When there is a fault on the line, the prediction model used is no longer concordant with the real line and the prediction error is no longer zero. The formula for calculating the trip signal A provides a signal proportional to the prediction error. If A reaches a value above a prescribed threshold value, a fault on the line to be protected is inferred. The threshold value can preferably assume the value 1.

In the fault magnitude A, ix0T(k−j) represents the instantaneous value of the comparison current at the common comparison location, as calculated from the line end T, with a delay of J samples based on the present sample k. The value M represents the length of the data window. The value N represents the number of line ends taken into consideration.

Figure 7:
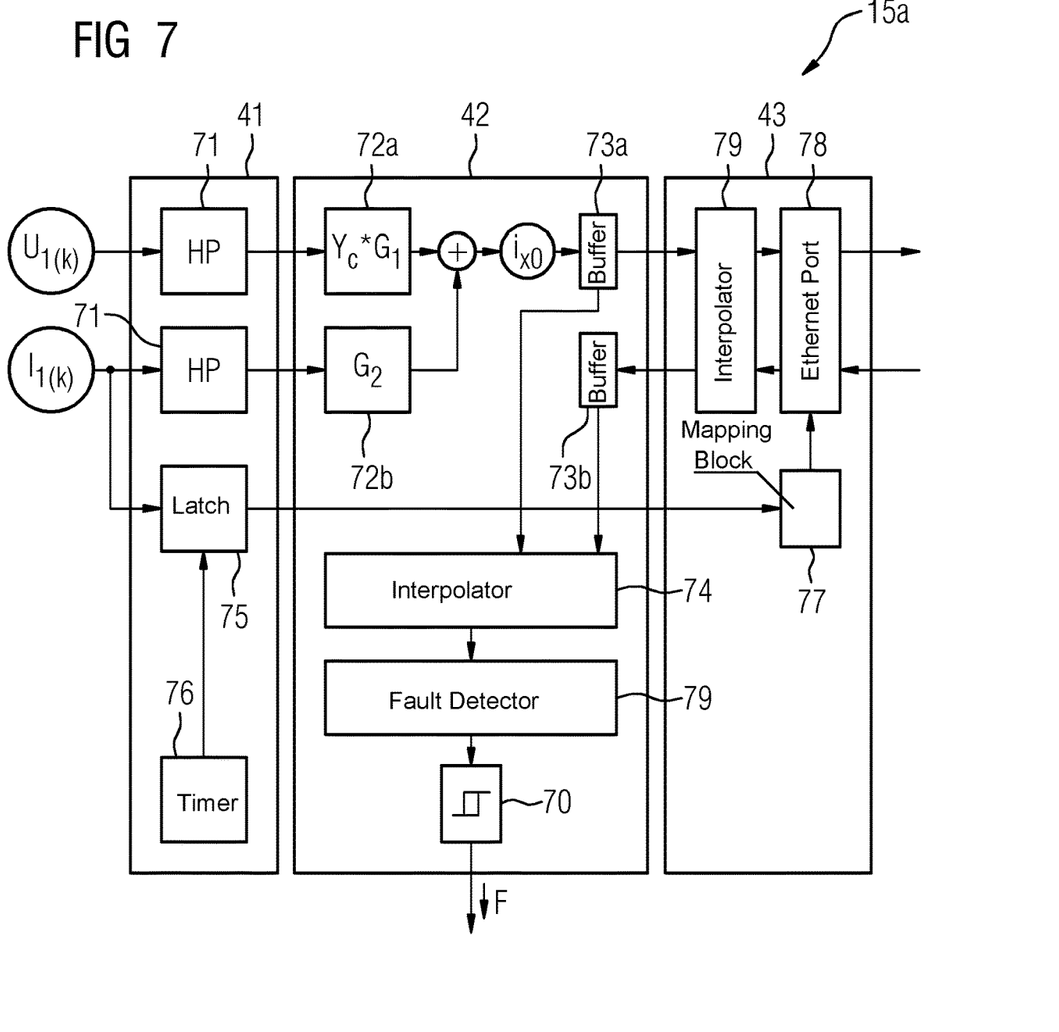
FIG. 7 is a schematic block diagram of an exemplary embodiment of an electrical protective device in a more detailed depiction.

FIG. 7 depicts a block diagram of a protective device 15a in a more detailed view. The design of the protective devices 15b, 15c may be correspondent.

Figure 8:
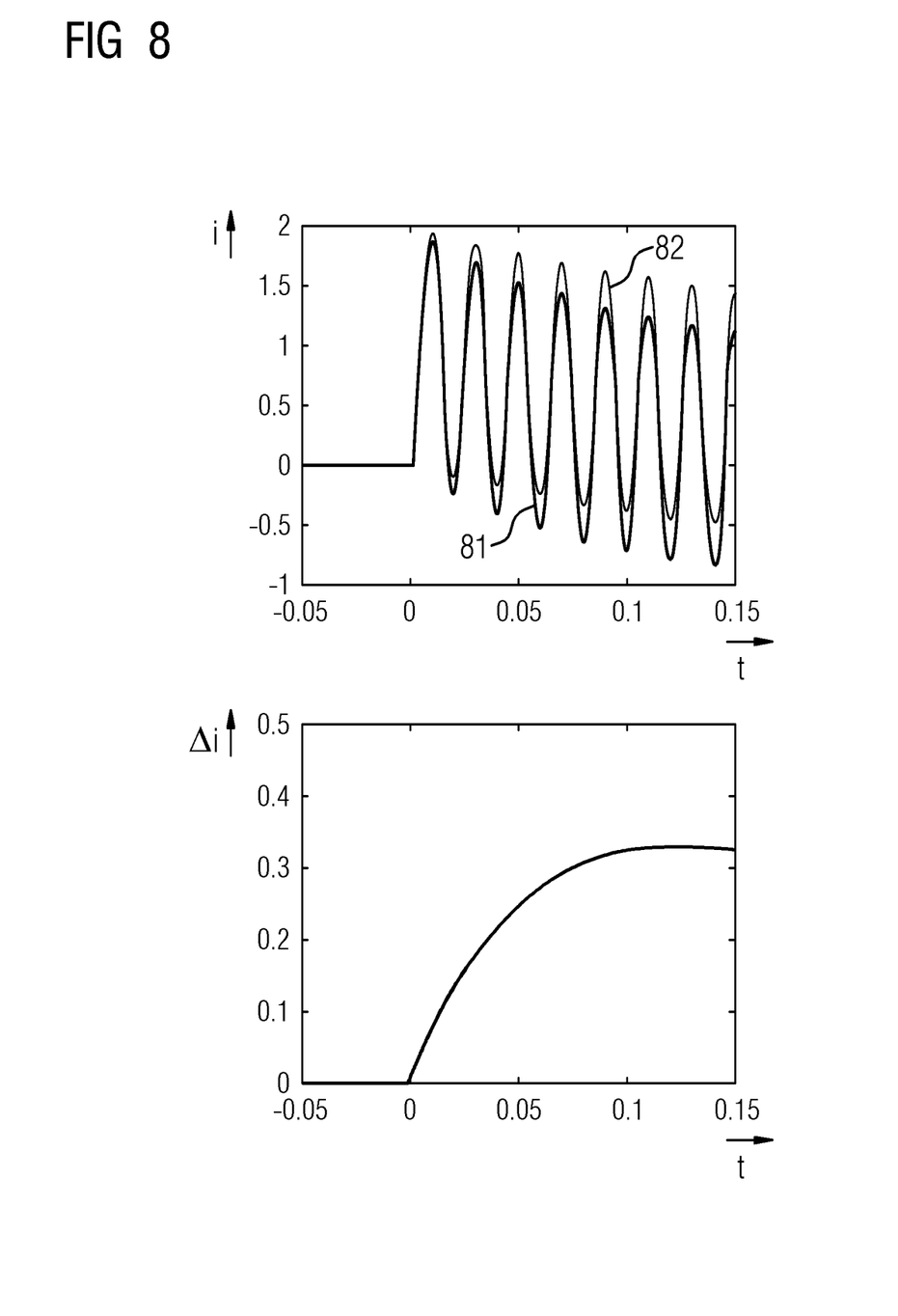
FIG. 8 are graphs showing exemplary current profiles without filtering.
Figure 9:
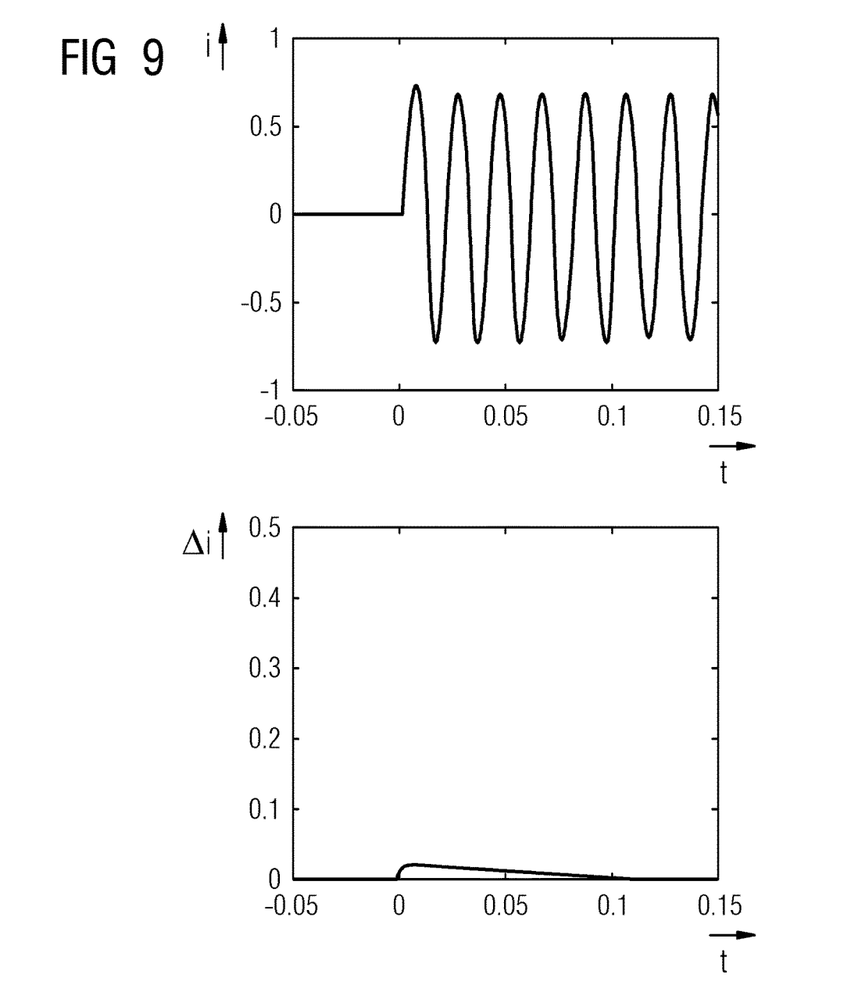
FIG. 9 are graphs showing exemplary current profiles with filtering.

As already described for FIG. 4, the protective device 15a contains a measuring device 41, an evaluation device 42 and a communication device 43. The measuring device 41 is supplied with locally recorded measurement signals for currents and voltages, said signals being converted into current and voltage values. The local input signals $u_1(k)$ and $i_1(k)$ are preferably filtered by means of a high-pass filter 71 in this case. FIGS. 8 and 9 depict the action of a $1^{st}$ order high-pass filter on the current signals from two line ends and on the difference current by way of example. The high-pass filter is assumed to have the rated frequency as corner frequency. A different time constant of the primary transformers in the signal path results in different DC components in the secondary signals of the primary transformers during the current and voltage measurement at the individual line ends. In the example of FIG. 8, the behavior of a linearized transformer is depicted by means of the curve 81 and the behavior of a toroidal core transformer is depicted in the curve 82. The difference signal Δi for the instantaneous values of the two transformers would result in more than a 30% difference current based on the amplitude of the current signal. As can be seen in FIG. 9, even with the simple $1^{st}$ order high-pass filtering, the difference current can already be lowered to approximately 2% for the same transformers. Thus, the influence of different transformers in the instantaneous values can be eliminated almost completely by means of high-pass filtering.

The filtered current and voltage values are transferred to the evaluation device 42, where they are processed in the blocks 72a and 72b by means of digital filtering as described in FIG. 6. Adding the filter results determines the comparison current $i_{x0}$.

The locally ascertained comparison current value $i_{x0}$ is transferred to a transmit buffer store 73a. From there, it is firstly transferred to the communication device 43 in order to be transmitted to the other protective devices 15b, 15c. Secondly, it is supplied to an interpolation device 74.

Moreover, the comparison current value is provided with a timestamp of the local relative time of the protective device 15a and mapped onto the time axis of the Master Clock of the common absolute time kept in sync between the protective devices 15a, 15b, 15c e.g. by means of the PTP protocol. The timestamp of the samples in the local relative time is determined by using a hardware latch 75, which, at the time of sampling of the local samples, stores the present value of the device relative time provided by an internal timer 76. Since the PTP protocol likewise uses the device relative time of the internal timer 76 as the reference to the global time in the device combination (what is known as the "Master Clock"), the local relative time of the protective device 15a can be mapped onto the global time of the master clock in the device combination. This mapping is performed by means of the mapping block 77. The value pairs ix0(k) and the corresponding PTP time are accumulated in the data block that is to be transmitted next. In this case, it is e.g. possible for the comparison current values at a common comparison location and the associated timestamps to be collected for a period of 0.5 ms. An applicable message is sent using the IP network stack 79 via a physical Ethernet port 78 of the protective device 15a, e.g. as a UDP (User Datagram Protocol) data packet. Preferably, a multicast address is used for this purpose in order to send the data packet to all other protective devices 15b, 15c in the differential protection system at the same time. In return, the data packets of the other protective devices 15b, 15c in the differential protection system are received via the Ethernet port 78. All received data packets are buffered in a received buffer store 73b as time/current value pairs for further use.

Using the Ethernet port 78, the protective device 15a is also used to perform the PTP protocol in order to obtain an absolute time that is synchronous between all protective devices 15a, 15b, 15c in the differential protection system. The fundamental way in which the PTP protocol works is explained e.g. on the Internet under the link http://www.ni-.com/newsletter/50130/en/. A prerequisite for the use of the PTP protocol is support for the hardware timestamping of the protocol by all network components 17 (cf. FIGS. 1 and 2), involved in the communication between the protective devices 15a, 15b, 15c. This prerequisite is met in modern MPLS (Multiprotocol Label Switching) networks. Many network operators equip their networks with this technology. Thus, a high level of availability of the necessary communication networks between substations can be assumed.

The respectively timestamped comparison current values are provided to the interpolator 74 of the evaluation device 42 from the transmit buffer store 73a and the receive buffer store 73b. Since the times of sampling in the devices may be asynchronous in relation to one another, the comparison current values need to be recalculated for a common reference time. This can be done e.g. using the method for resampling samples described in international patent disclosure WO 2015/110150 A1.

The comparison current values whose timings have been brought into line with one another can subsequently be used to perform a check, in a fault detection block 79, on whether there is a fault on the line. This can be accomplished by using equation 19 to calculate the fault magnitude A, for example. If the fault magnitude exceeds a threshold value 70, which may have e.g. the value 1, then the evaluation device 42 delivers the fault signal F.

The described evaluation can be performed in each protective device 15a, 15b, 15c of the differential protection system separately. The locally generated fault signals are then used to trip the respective local circuit breaker 12a, 12b, 12c.

In the described exemplary embodiment of a method for detecting a fault on a line of an electrical power supply system, the hitherto standard communication is replaced with a UDP/IP communication contemporary for wide area networks. At the same time, a line model on a travelling wave basis is used in order to combine the speed advantage of a wideband IP network in respect of the low communication latencies arising in the network with the speed advantage of an instantaneous value current comparison that becomes possible by means of a travelling wave line model and simultaneous high-pass filtering, and therefore to allow much faster differential protection that avoids the known disadvantages of previous differential protection solutions.

Although the invention has been illustrated and described in more detail by means of preferred exemplary embodiments above, the invention is not limited by the disclosed examples, and other variations can be derived therefrom by a person skilled in the art without departing from the scope of protection of the patent claims that follow.

The invention claimed is:

1. A method for detecting a fault on a line of an electrical power supply system, the method comprises the steps of:
measuring first current values at a first line end of the line;
measuring further current values at least at a further line end of the line;
using the first and the further current values to check whether there is a fault on the line;
measuring first voltage values at the first line end of the line;
measuring further voltage values at the at least one further line end of the line;
using the first current and voltage values measured at the first line end to ascertain first comparison current values indicating a current flowing at a comparison location on the line;
using the further current and voltage values measured at the at least one further line end to ascertain further comparison current values indicating a current flowing at the comparison location on the line;
using the first and the further comparison current values to check for a presence of a fault on the line; and
generating a fault signal if the check has resulted in a fault present on the line being detected.

2. The method according to claim 1, which further comprises determining the first and the further comparison current values by using a mathematical model of the line for a fault-free case.

3. The method according to claim 2, which further comprises estimating the first and the further comparison current values by using the first and the further current and voltage values and also the mathematical model of the line, wherein an estimation is performed by considering a propagation of travelling waves along the line.

4. A method for detecting a fault on a line of an electrical power supply system, the method comprises the steps of:
measuring first current values at a first line end of the line;
measuring further current values at least at a further line end of the line;
using the first and the further current values to check whether there is a fault on the line;
measuring first voltage values at the first line end of the line;
measuring further voltage values at the at least one further line end of the line;
using the first current and voltage values measured at the first line end to ascertain first comparison current values indicating a current flowing at a comparison location on the line;
using the further current and voltage values measured at the at least one further line end to ascertain further comparison current values indicating a current flowing at the comparison location on the line;
using the first and the further comparison current values to check for a presence of a fault on the line; and
generating a fault signal if the check has resulted in a fault present on the line being detected;
wherein the first and the further comparison current and voltage values are ascertained by performing an estimation that uses a mathematical model of the line for a fault-free case and that considers a propagation of travelling waves along the line; and
wherein the estimation of the first and the further comparison current values includes subjecting the first and the further current and voltage values to filtering, wherein a filter is used to reproduce a transfer function dependent at least on a propagation constant of a travelling wave along the line and/or a transfer function dependent on a characteristic impedance of the line.

5. The method according to claim 1, which further comprises:
using the first and the further comparison current values to form a fault magnitude; and
detecting the fault on the line if the fault magnitude exceeds a prescribed threshold value.

6. The method according to claim 1, which further comprises subjecting the first and the further current and voltage values to filtering using a high-pass filter.

7. The method according to claim 1, which further comprises:
performing ascertainment of the first and the further comparison current values at each of the first and the further line ends; and
transmitting the first and the further comparison current values ascertained at the first and the further line ends between the first and the further line ends by means of an Internet protocol-based data communication.

8. The method according to claim 7, wherein the line has more than two line ends and results in a transmission of the first and the further comparison current values between the line ends being effected by means of multicast messages.

9. The method according to claim 1, which further comprises assigning the first and the further comparison current values timestamps.

10. The method according to claim 9, which further comprises synchronizing timers used for timestamping at the first and the further line ends by means of a time pulse of a central timer or a time synchronization protocol.

11. The method according to claim 1, which further comprises performing the check to determine whether there is a fault on the line at each of the first and the further line ends.

12. A method for detecting a fault on a line of an electrical power supply system, the method comprises the steps of:
measuring first current values at a first line end of the line;
measuring further current values at least at a further line end of the line;
using the first and the further current values to check whether there is a fault on the line;
measuring first voltage values at the first line end of the line;
measuring further voltage values at the at least one further line end of the line;
using the first current and voltage values measured at the first line end to ascertain first comparison current values indicating a current flowing at a comparison location on the line;
using the further current and voltage values measured at the at least one further line end to ascertain further comparison current values indicating a current flowing at the comparison location on the line;

using the first and the further comparison current values to check for a presence of a fault on the line;

performing the check to determine whether there is a fault on the line at each of the first and the further line ends;

generating a fault signal if the check has resulted in a fault present on the line being detected;

wherein the first and the further comparison current values are received at each of the first and the further line ends that have been ascertained at the other line ends; and wherein received comparison current values and locally ascertained comparison current values are time aligned with one another by means of a renewed sampling and a subsequent interpolation.

13. The method according to claim 10, wherein the time synchronization protocol is a precision time protocol.

14. A protective device for detecting a fault on a line of an electrical power supply system, the protective device comprising:

a measuring device set up for recording first current values measured at a first line end of the line;

a communication device set up for receiving further current values measured at least at a further line end of the line;

an evaluation device set up to use the first and the further current values to check whether there is a fault on the line;

said measuring device set up to record first voltage values measured at the first line end of the line;

said communication device set up to receive further voltage values measured at the at least one further line end of the line;

said evaluation device set up to use the first current and voltage values measured at the first line end to ascertain first comparison current values indicating a current flowing at a comparison location on the line;

said evaluation device set up to use the further current and voltage values measured at the at least one further line end to ascertain further comparison current values indicating a current flowing at the comparison location on the line; and said evaluation device set up to use the first and the further comparison current values to check for a presence of a fault on the line and to generate a fault signal if the check has resulted in a fault present on the line being detected.

15. A protective system for detecting a fault on a line of an electrical power supply system, wherein the protective system comprising:

a communication connection; and at least two protective devices according to claim 14 connected to one another via said communication connection.

16. The protective system according to claim 15, wherein:

the protective system is set up to detect the fault on the line having more than two ends; and one of said protective devices is provided at each end of the line, wherein each of said protective devices are connected to one another via said communication connection.

\* \* \* \* \*